(12) United States Patent
Mao

(10) Patent No.: US 12,096,587 B2
(45) Date of Patent: Sep. 17, 2024

(54) SERVER CASING ASSEMBLY AND SUPPORT DEVICE

(71) Applicant: WISTRON CORP., New Taipei (TW)

(72) Inventor: Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 226 days.

(21) Appl. No.: 17/933,553

(22) Filed: Sep. 20, 2022

(65) Prior Publication Data
US 2023/0337386 A1     Oct. 19, 2023

(30) Foreign Application Priority Data

Apr. 14, 2022    (CN) .......................... 202210391002.2

(51) Int. Cl.
*H05K 7/14*    (2006.01)
(52) U.S. Cl.
CPC ......... *H05K 7/1488* (2013.01); *H05K 7/1452* (2013.01); *H05K 7/1487* (2013.01)
(58) Field of Classification Search
None
See application file for complete search history.

(56) References Cited

U.S. PATENT DOCUMENTS

| 8,456,853 | B2 | 6/2013 | Lin et al. | |
|---|---|---|---|---|
| 10,455,724 | B1 * | 10/2019 | Zhang | H05K 7/18 |
| 11,150,705 | B1 * | 10/2021 | Hsieh | H05K 7/1487 |
| 2015/0137673 | A1 * | 5/2015 | Mo | G11B 33/124 |
| | | | | 312/333 |

FOREIGN PATENT DOCUMENTS

| TW | M312177 U | 5/2007 |
|---|---|---|
| TW | 201227212 A | 7/2012 |

OTHER PUBLICATIONS

TW Office Action dated Feb. 14, 2023 in Taiwan application No. 111118793.

* cited by examiner

*Primary Examiner* — James Wu
*Assistant Examiner* — Christopher L Augustin
(74) *Attorney, Agent, or Firm* — McClure, Qualey & Rodack, LLP

(57) ABSTRACT

A support device, holding a connector in a casing, includes a base frame and a positioning frame. The base frame includes a first mount plate having a through hole, the through hole has a first end and a second end, a fastener of the casing is disposed through the through hole, and the connector is disposed on the first mount plate. The positioning frame includes a positioning portion. The positioning frame is movably disposed on the base frame to be in a first position or a second position. When the positioning frame is located in the first position, the positioning portion is located between the first end and the second end of the through hole. When the positioning frame is located in the second position, the positioning portion is not located between the first end and the second end.

20 Claims, 11 Drawing Sheets

SERVER CASING ASSEMBLY AND SUPPORT DEVICE

CROSS-REFERENCE TO RELATED APPLICATIONS

This non-provisional application claims priority under 35 U.S.C. § 119(a) on Patent Application No(s). 202210391002.2 filed in China on Apr. 14, 2022, the entire contents of which are hereby incorporated by reference.

TECHNICAL FIELD

The disclosure relates to a server casing assembly and a support device.

BACKGROUND

A 2U server with four nodes is a server where there are four motherboards arranged in a server casing having a height of 2U. These four motherboards work independently so as to form four independent server systems, thereby achieving more nodes and high power density of the server. Theoretically, one 2U server of four nodes is equivalent to four conventional 2U servers.

There are two ways for connecting a node server to a host system (e.g., a storage system, a power supply system, or a control system), one is the board-to-board connection, and the other is the cable connection. No matter which way is adopted, a frame is required to be mounted in the server casing to help the connection between them, but the frame is generally fixed to a bottom plate of the server casing via screws, which is troublesome in fastening or removing the screws and may have an undesired issue of loosened screws.

SUMMARY

The disclosure provides a server casing assembly and a support device which is capable of being installed in a casing of the server casing assembly in a convenient way.

One embodiment of the disclosure provides a support device. The support device holds at least one connector in a casing. The support device includes a base frame and a positioning frame. The base frame includes a first mount plate. The first mount plate has at least one through hole with a first end and a second end opposite to each other, at least one fastener of the casing is disposed through the through hole, and the connector is disposed on the first mount plate. The positioning frame includes at least one positioning portion. The positioning frame is movably disposed on the base frame and is movable between a first position and a second position. When the positioning frame is located in the first position, the positioning portion of the positioning frame is located between the first end and the second end of the through hole. When the positioning frame is located in the second position, the positioning portion of the positioning frame is not located between the first end and the second end of the through hole.

Another embodiment of the disclosure provides a server casing assembly. The server casing assembly includes a casing, a support device, and at least one connector. The casing includes a bottom plate, a side plate and at least one fastener. The side plate is connected to a side of the bottom plate, and the fastener is mounted on the side plate. The support device includes a base frame and a positioning frame. The base frame includes a first mount plate. The first mount plate has at least one through hole with a first end and a second end opposite to each other, the fastener of the casing is disposed through the through hole. The positioning frame includes at least one positioning portion. The positioning frame is movably disposed on the base frame and is movable between a first position and a second position. When the positioning frame is located in the first position, the positioning portion of the positioning frame is located between the first end and the second end of the through hole. When the positioning frame is located in the second position, the positioning portion of the positioning frame is not located between the first end and the second end of the through hole. The connector is disposed on the first mount plate.

According to the server casing assembly and the support device as disclosed above, the positioning frame is movably disposed on the base frame, such that the fastener of the casing can be rapidly restricted in the first end of the through hole or reach the second end of the through hole. Therefore, the support device can be efficiently and reliably mounted on the casing.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
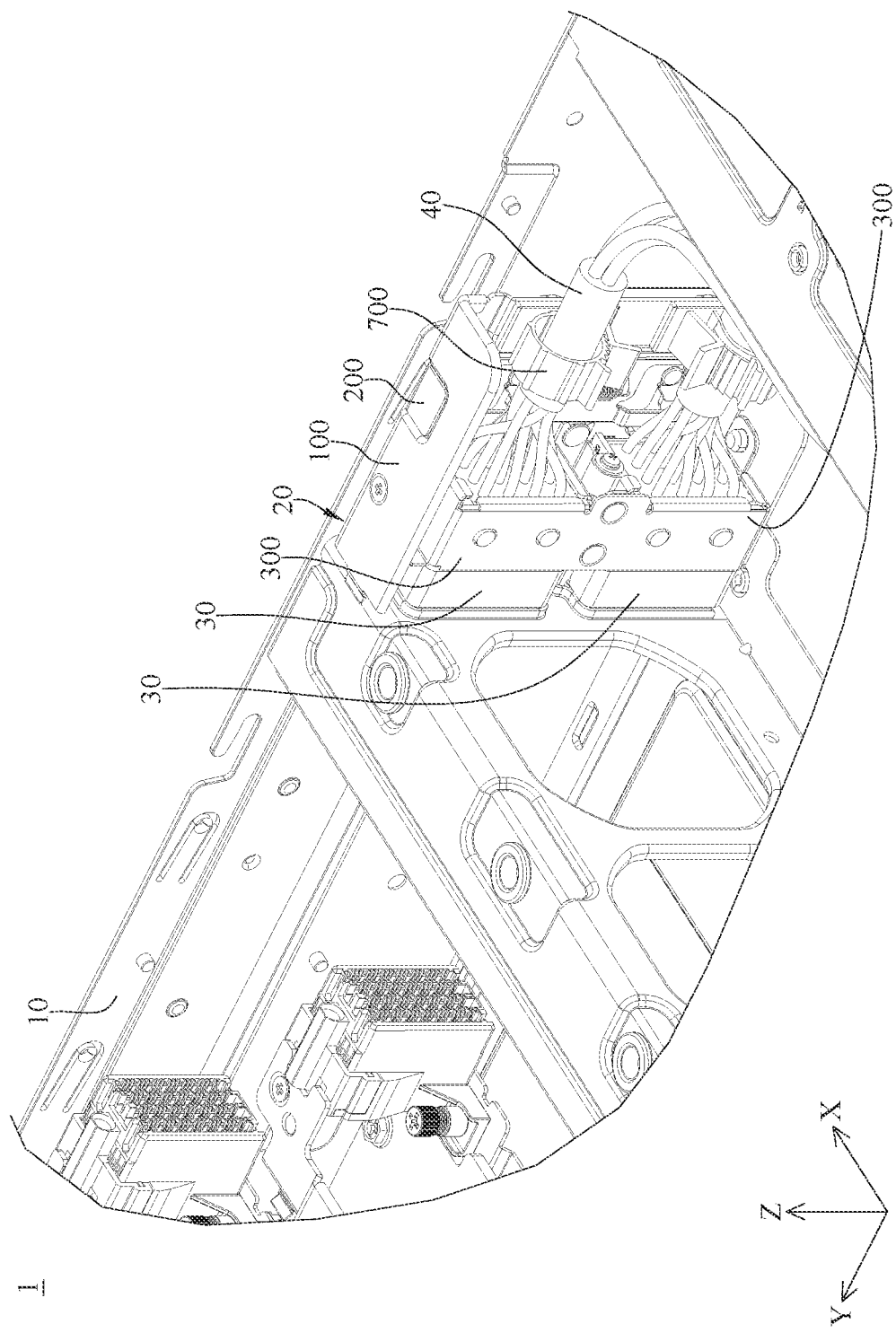
FIG. 1 is a partial perspective view of a server casing assembly according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
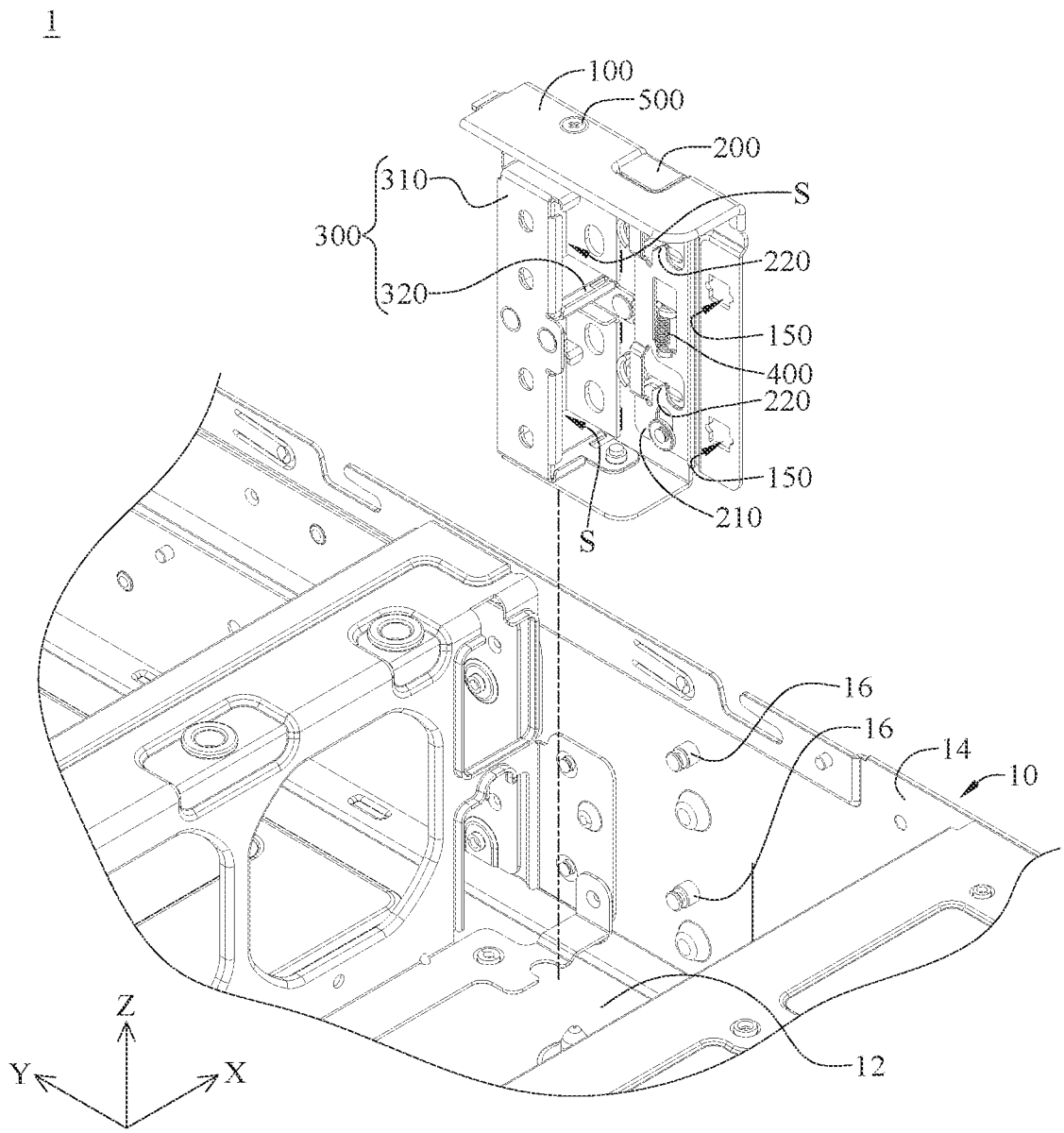
FIG. 2 is a partial exploded view of a casing and a support device in FIG. 1.
Figure 3:
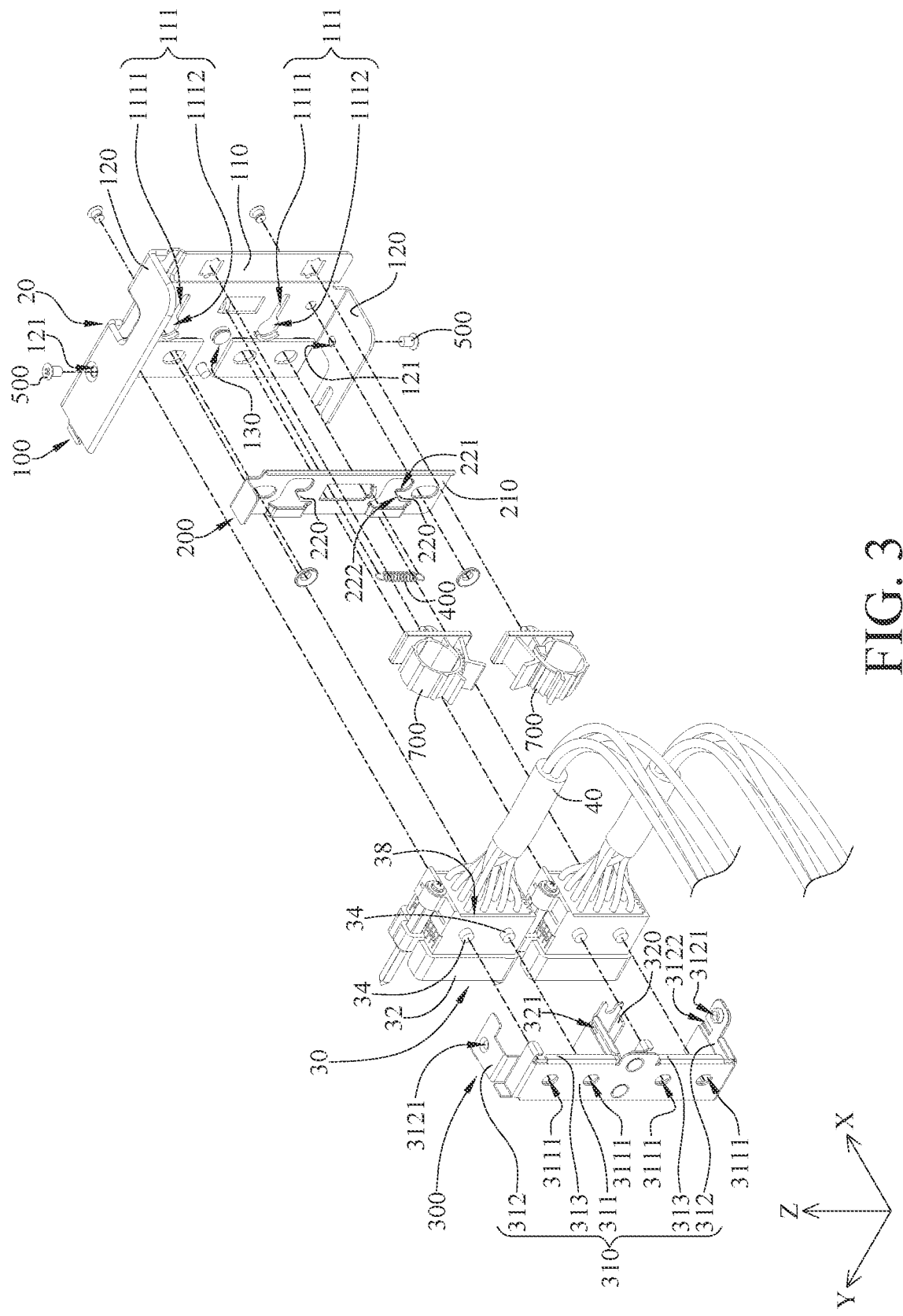
FIG. 3 is an exploded view of the support device and connectors in FIG. 1.
Figure 4:
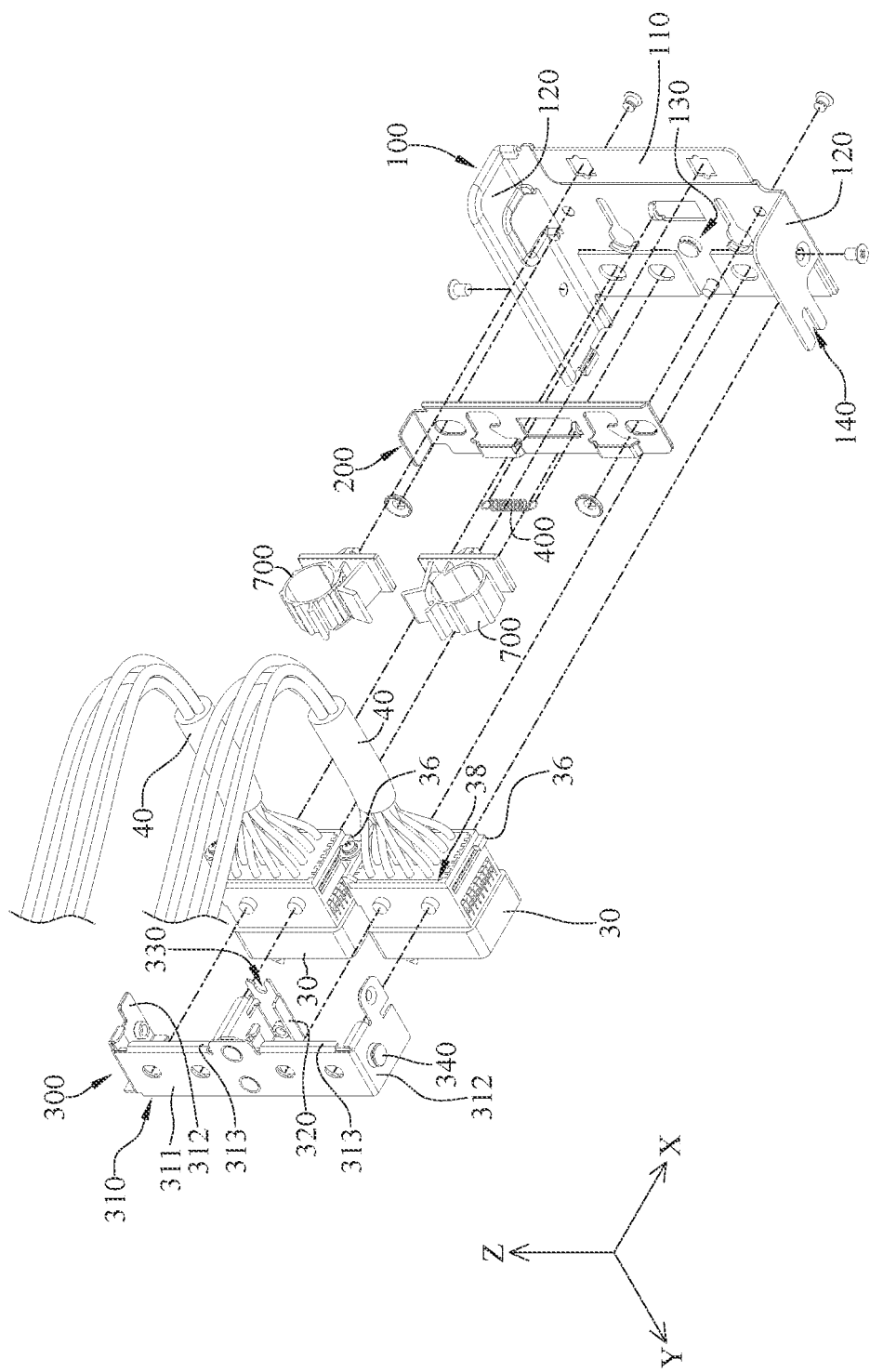
FIG. 4 is another exploded view of the support device and the connectors in FIG. 3.

Refer to FIGS. 1 to 4, where FIG. 1 is a partial perspective view of a server casing assembly 1 according to a first embodiment of the disclosure, FIG. 2 is a partial exploded view of a casing 10 and a support device 20 in FIG. 1, FIG. 3 is an exploded view of the support device 20 and connectors 30 in FIG. 1, and FIG. 4 is another exploded view of the support device 20 and the connectors 30 in FIG. 3.

In this embodiment, the server casing assembly 1 is, for example, a casing assembly of a node server. The server casing assembly 1 may accommodate a processing module, a disk drive module, and a fan module. The server casing assembly 1 includes a casing 10, a support device 20, and two connectors 30. The casing 10 includes a bottom plate 12, a side plate 14, and two fasteners 16. The side plate 14 is connected to one side of the bottom plate 12. The fasteners 16 are, for example, holders mating pear-shaped holes. The fasteners 16 are mounted on the side plate 14 in, for example, a riveting manner.

The support device 20 includes a base frame 100, a positioning frame 200, and a mount frame 300. The base frame 100 includes a first mount plate 110 and two second mount plates 120. The first mount plate 110 has two through holes 111. Each of the through holes 111 has a first end 1111 and a second end 1112 opposite to each other. The fasteners 16 have sizes which are larger than that of the first ends 1111 of the through holes 111 and smaller than that of the second ends 1112 of the through holes 111. Specifically, taking one fastener 16 and one through hole 111 for example, the fastener 16 can be disposed through or removed from the second end 1112 of the through hole 111, and the fastener 16 cannot be removed from the through hole 111 when located in the first end 1111 of the through hole 111 and engaged with the first mount plate 110. The fasteners 16 of the casing 10 are respectively movably located in the through holes 111 so as to be located at the first ends 1111 or the second ends 1112 of the through holes 111. The second mount plates 120 are respectively connected to two opposite sides of the first mount plate 110.

The positioning frame 200 includes a main portion 210 and two positioning portions 220. The positioning portions 220 are connected to the main portion 210, and each of the positioning portions 220 has a positioning surface 221 and an guide surface 222 located at two opposite sides thereof. The main portion 210 is slidably disposed on the first mount plate 110, such that the positioning frame 200 is movable between a first position (shown in FIG. 10) and a second position (shown in FIG. 9). When the positioning frame 200 is located in the first position, the positioning portions 220 of the positioning frame 200 are respectively located between the first ends 1111 and the second ends 1112 of the through holes 111, such that the fasteners 16 of the casing 10 are respectively positioned at the first ends 1111 of the through holes 111 by the positioning surfaces 221 of the positioning portions 220 of the positioning frame 200. When the positioning frame 200 is located in the second position, the positioning portions 220 of the positioning frame 200 are not located between the first ends 1111 and the second ends 1112 of the through holes 111, such that the fasteners 16 of the casing 10 can be respectively moved away from the first ends 1111 of the through holes 111.

In this embodiment, the support device 20 may further include a restoring component 400. The restoring component 400 is, for example, an extension spring. One end of the restoring component 400 is fixed to the base frame 100, and the other end of the restoring component 400 is fixed to the main portion 210 of the positioning frame 200 so as to provide a force to the positioning frame 200 for moving the positioning frame 200 towards the first position.

In this embodiment, the positioning frame 200 is slidably disposed on the first mount plate 110, but the disclosure is not limited thereto; in some other embodiments, the positioning frame may be rotatably disposed on the first mount plate.

Note that the quantities of the through holes 111, the fasteners 16, and the positioning portions 220 are not restricted in the disclosure and may be modified to be one or more than three.

The mount frame 300 is mounted on the first mount plate 110 of the base frame 100, and the mount frame 300 and the base frame 100 form at least one accommodation space S. In specific, the mount frame 300 includes a frame body 310 and a partition 320. The frame body 310 includes a first plate 311 and two second plates 312. The second plates 312 are respectively connected to two opposite sides of the first plate 311. The partition 320 is fixed to the first plate 311 of the frame body 310. The second plates 312 are respectively mounted on the second mount plates 120 of the base frame 100 via, for example, screws. Specifically, the support device 20 may further include two fasteners 500. The fasteners 500 are, for example, screws. Each of the second mount plates 120 of the base frame 100 has a first mount hole 121, and each of the second plates 312 of the mount frame 300 has a second mount hole 3121. The fasteners 500 are respectively disposed through the first mount holes 121 and screwed into the second mount holes 3121, such that the second plates 312 are respectively mounted on the second mount plates 120 of the base frame 100. By doing so, the frame body 310 is mounted on the base frame 100, and the frame body 310, the partition 320, and the base frame 100 form two accommodation spaces S. The accommodation spaces S respectively accommodate the connectors 30.

In this embodiment, the base frame 100 may further include a first mount structure 130 and a second mount structure 140. The first mount structure 130 and the second mount structure 140 are respectively located at the first mount plate 110 and one of the second mount plates 120. The mount frame 300 may further include a third mount structure 330 and a fourth mount structure 340. The third mount structure 330 and the fourth mount structure 340 are respectively located at the partition 320 and one of the second plates 312. The third mount structure 330 and the first mount structure 130 are respectively an engagement hole and an engagement block, and the third mount structure 330 is removably assembled with the first mount structure 130. The second mount structure 140 and the fourth mount structure 340 are respectively an engagement hole and an engagement block, and the fourth mount structure 340 is removably assembled with the second mount structure 140. Therefore, during the assembly of the base frame 100 and the mount frame 300, the base frame and the mount frame 300 may be preliminarily positioned onto each other via the aforementioned mount structures for facilitating the fasteners 500 to fix the base frame 100 and the mount frame to each other.

Note that the quantity of the mount structures of the base frame 100 and the quantity of the mount structures of the mount frame 300 are not restricted in the disclosure and may be modified. In some other embodiments, the base frame and the mount frame each may have only one mount structure for achieving the preliminary positioning between the base frame and the mount frame.

In this embodiment, the mount frame 300 and the base frame 100 form the two accommodation space S via the partition 320, but the disclosure is not limited thereto; in some other embodiments, in the case that there is only one connector required to be accommodated in the space formed by the mount frame and the base frame, the partition may be omitted.

Figure 5:
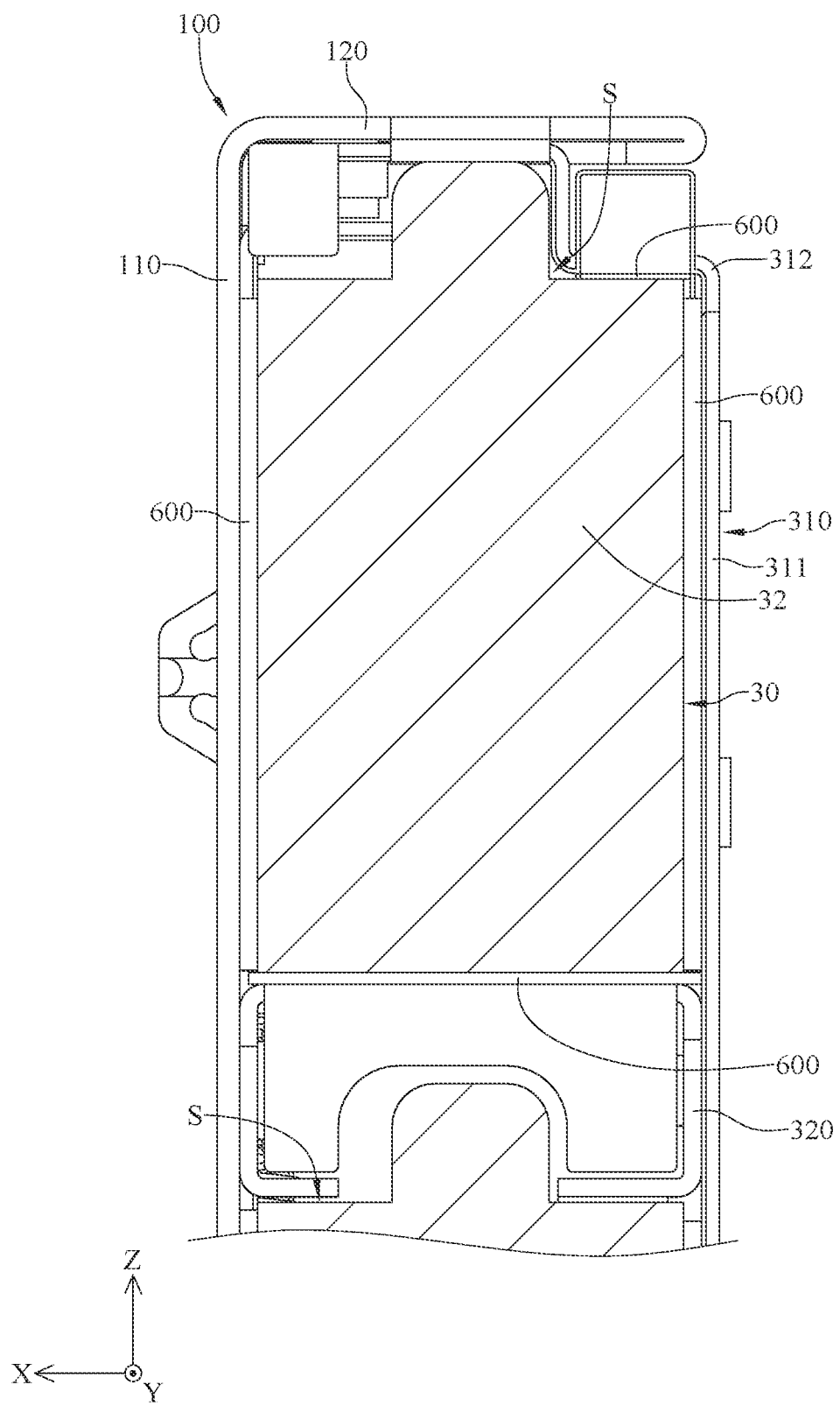
FIG. 5 is a partial cross-sectional view of the support device and one of the connectors in FIG. 1.

Refer to FIG. 5, which is a partial cross-sectional view of the support device 20 and one of the connectors 30 in FIG. 1. In this embodiment, the support device 20 may further include a plurality of pads 600. The pads 600 are, for example, made of a soft and elastic material, such as rubber. The pads 600 are respectively disposed on the mount frame 300 and the base frame 100 and located at different sides of the accommodation space S, such that the connector 30 in this accommodation space S is capable of being slightly moved relative to the support device 20; that is, the connector 30 can be regarded as being movably disposed in the support device 20.

In this embodiment, the pads 600 enable the connector 30 to be movable in the support device 20 via its elasticity, but the disclosure is not limited thereto; in some embodiments, the support device may include elastic components of another type, such as springs, for enabling the connector to be movable relative to the base frame.

In this embodiment, the first plate 311 of the base frame 100 has a plurality of first positioning holes 3111. Each of the connectors 30 includes a plug 32 and a plurality of first positioning protrusions 34 protruding from the plug 32. The first positioning protrusions 34 of the connectors 30 are respectively located in the first positioning holes 3111. The second plate 312 has a second positioning hole 3122, and the partition 320 has a second positioning hole 321. Each of the connectors 30 may further include a second positioning protrusion 36 protruding from the plug 32. In each of the connectors 30, the first positioning protrusion 34 and the second positioning protrusion 36 are respectively located at different sides of the plug 32. The second positioning protrusions 36 of the connectors are respectively located in the second positioning holes 3122 and 321.

In this embodiment, a gap is formed between each first positioning protrusion 34 and the first plate 311; in other words, each first positioning protrusion 34 has a size smaller than that of the first positioning hole 3111 where the first positioning protrusion 34 is located. Moreover, a gap is formed between each second positioning protrusion 36 and the second plate 312 (or the partition 320); in other words, each second positioning protrusion 36 has a size smaller than that of the second positioning hole 3122 (or 321) where the second positioning protrusion 36 is located. Therefore, the cooperation of the aforementioned protrusions and positioning holes enables the connectors 30 to be respectively movable relative to the base frame 100 in the accommodation spaces S, but defines movement ranges of the connectors 30 along X, Y and Z axis.

In this embodiment, the frame body 310 of the mount frame 300 may further include two positioning walls 313. The positioning walls 313 are connected to the first plate 311 and respectively correspond to the accommodation spaces S. Each of the plugs 32 of the connectors 30 has an outer surface 38. In each connector 30, the outer surface 38, the first positioning protrusions 34 and the second positioning protrusion 36 are respectively located at different sides of the plug 32, and the outer surface 38 faces the positioning wall 313. Therefore, when one connector 30 is connected to a corresponsive connector (not shown), the positioning wall 313 may be in contact with the outer surface 38 of the connector 30 so as to limit the movement of the connector 30 relative to the base frame 100 in Y axis, and thus the positioning wall 313 can define the movement range of the connector relative to the base frame 100 along Y axis.

In this embodiment, the mount frame 300 defines the movement range of the connectors 30 via the first positioning holes 3111, the second positioning holes 3122 and 321, and the positioning walls 313, but the disclosure is not limited thereto. In some other embodiments, the mount frame may define the movement range of the connectors via one or two kinds of the first positioning holes, the second positioning holes, and the positioning walls.

Note that the quantities of the first positioning holes 3111 and the first positioning protrusions 34 are not restricted in the disclosure and may be modified to be one.

In this embodiment, the connectors 30 are installed on the first mount plate 110 of the base frame 100 via the mount frame 300, but the disclosure is not limited thereto; in some other embodiments, the connectors may be directly installed on the first mount plate via screws.

In this embodiment, the first mount plate 110 may further have two insertion holes 150. The support device 20 may further include two wire holders 700. The wire holders 700 are respectively mounted into the insertion holes 150 of the first mount plate 110 of the base frame 100 so as to fix and arrange wires connected to the connectors 30.

Figure 6:
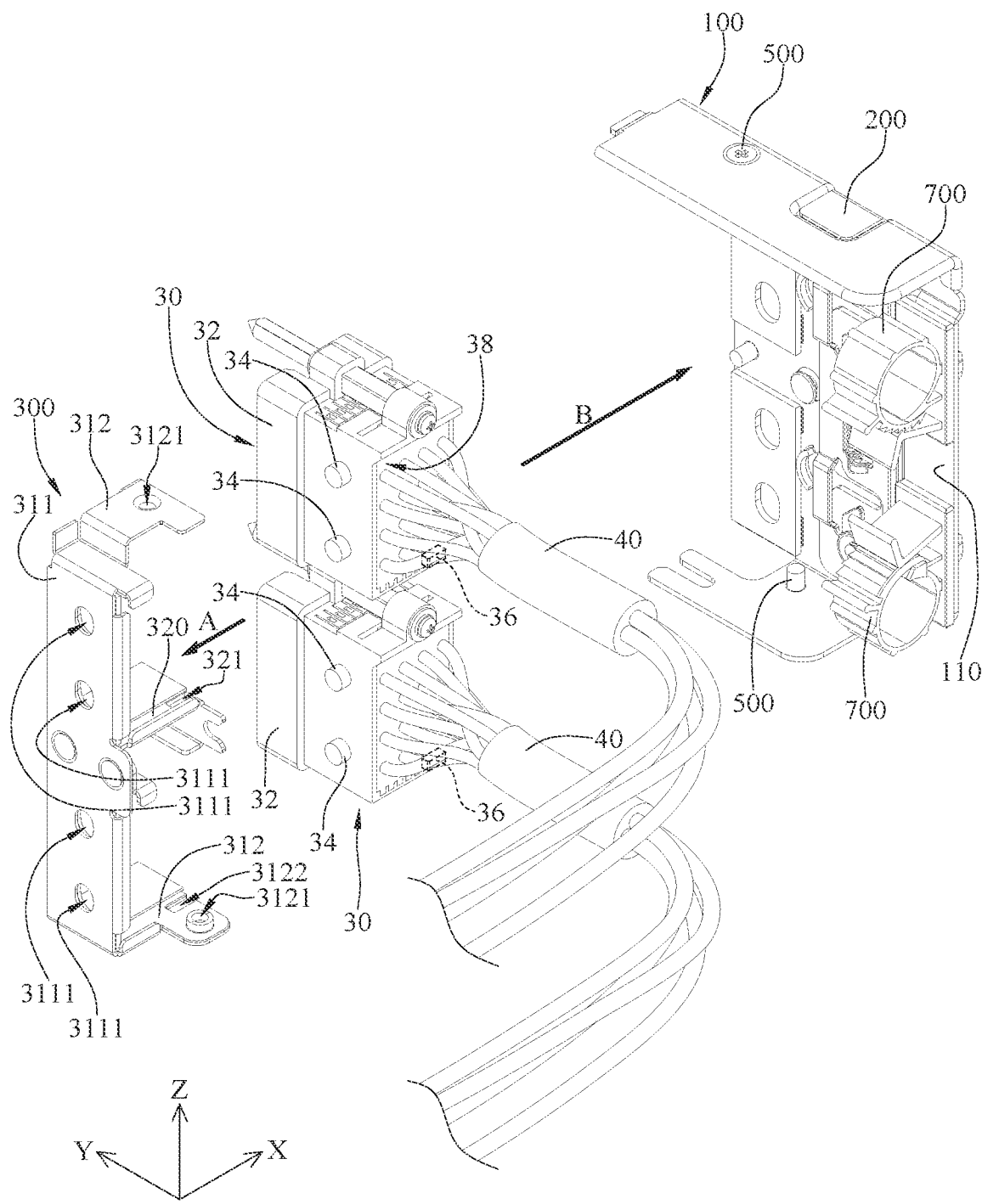
FIGS. 6 and 7 show the assembly of the connectors and the support device in FIG. 1.
Figure 7:
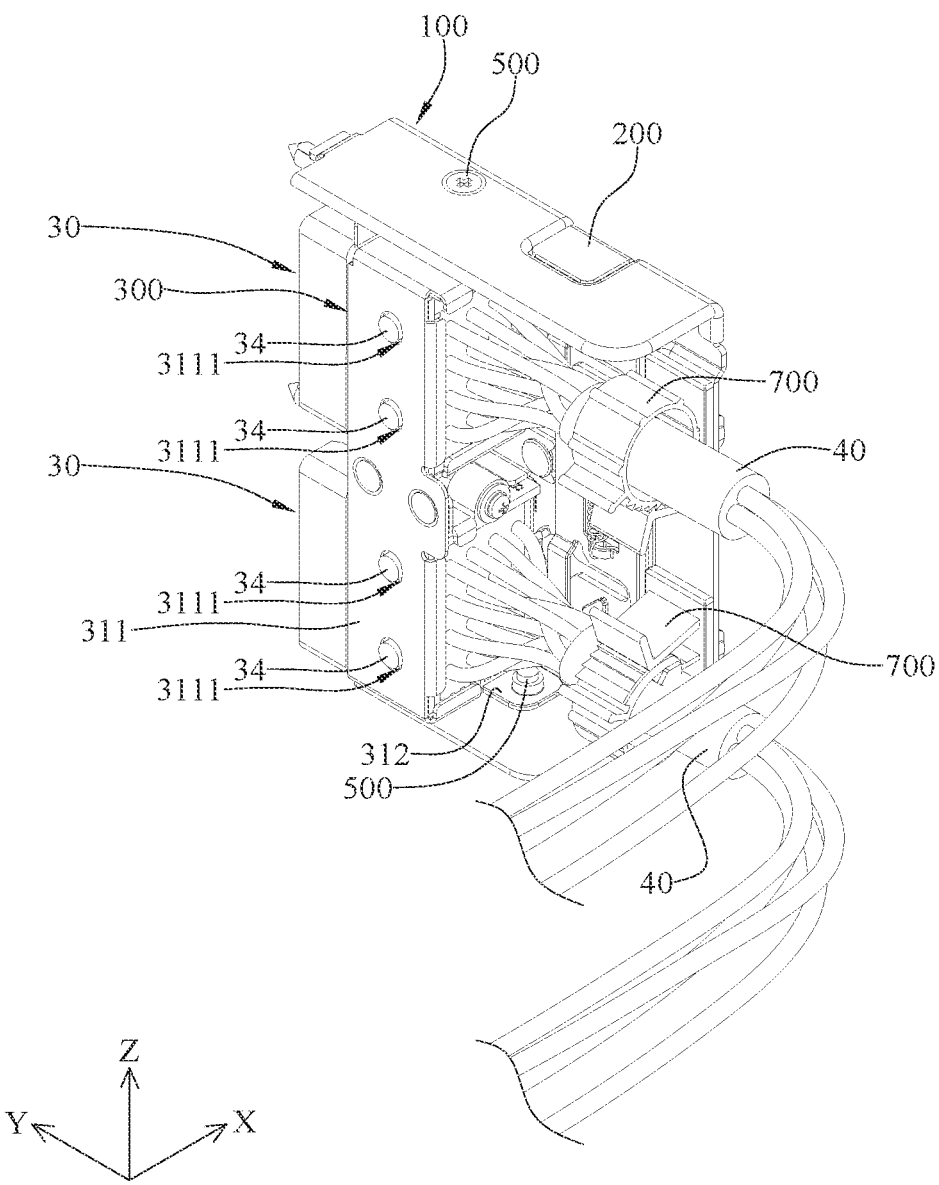

Refer to FIGS. 6 and 7, where FIGS. 6 and 7 show the assembly of the connectors 30 and the support device 20 in FIG. 1.

As shown in FIG. 6, the connectors 30 are moved along a direction A and mounted on the mount frame 300, such that the first positioning protrusions 34 of the connectors 30 are respectively inserted into the first positioning holes 3111 of the first plate 311 of the mount frame 300, and the second positioning protrusions 36 of the connectors 30 are respectively inserted into the second positioning hole 3122 of the second plate 312 and the second positioning hole 321 of the partition 320 of the mount frame 300. Then, the mount frame 300 with the connectors 30 are moved along a direction B and assembled with the base frame 100, and then the fasteners 500 fix the mount frame 300 and the base frame 100 to each other so as to respectively position the connectors 30 in the accommodation spaces S (as shown in FIG. 7) surrounded by the base frame 100 and the mount frame 300. Since different sides of each connector 30 are connected to the base frame 100 and the mount frame 300 via the pads 600, the pads 600 enable the connector 30 to be slightly movable along X axis and Z axis so as to facilitate the connectors 30 to be precisely connected with the corresponsive connectors (not shown). Moreover, the cooperation of the first positioning holes 3111, the second positioning holes 3122, 321 and the positioning walls 313 of the mount frame 300 and the first positioning protrusions 34, the second positioning protrusions 36 and the outer surfaces 38 of the connectors 30 defines the movement range of the connectors 30 relative to the base frame 100 along Y axis. Specifically, when the connectors 30 are respectively connected to the corresponsive connectors (not shown), the corresponsive connectors may push the connectors 30, such that the first positioning protrusions 34, the second positioning protrusions 36, and the outer surfaces 38 of the connectors 30 may be interfered with the mount frame 300 so as to prevent the connectors 30 from moving along the negative Y-axis direction, thereby facilitating the connections between the connectors 30 and the corresponsive connectors.

Figure 8:
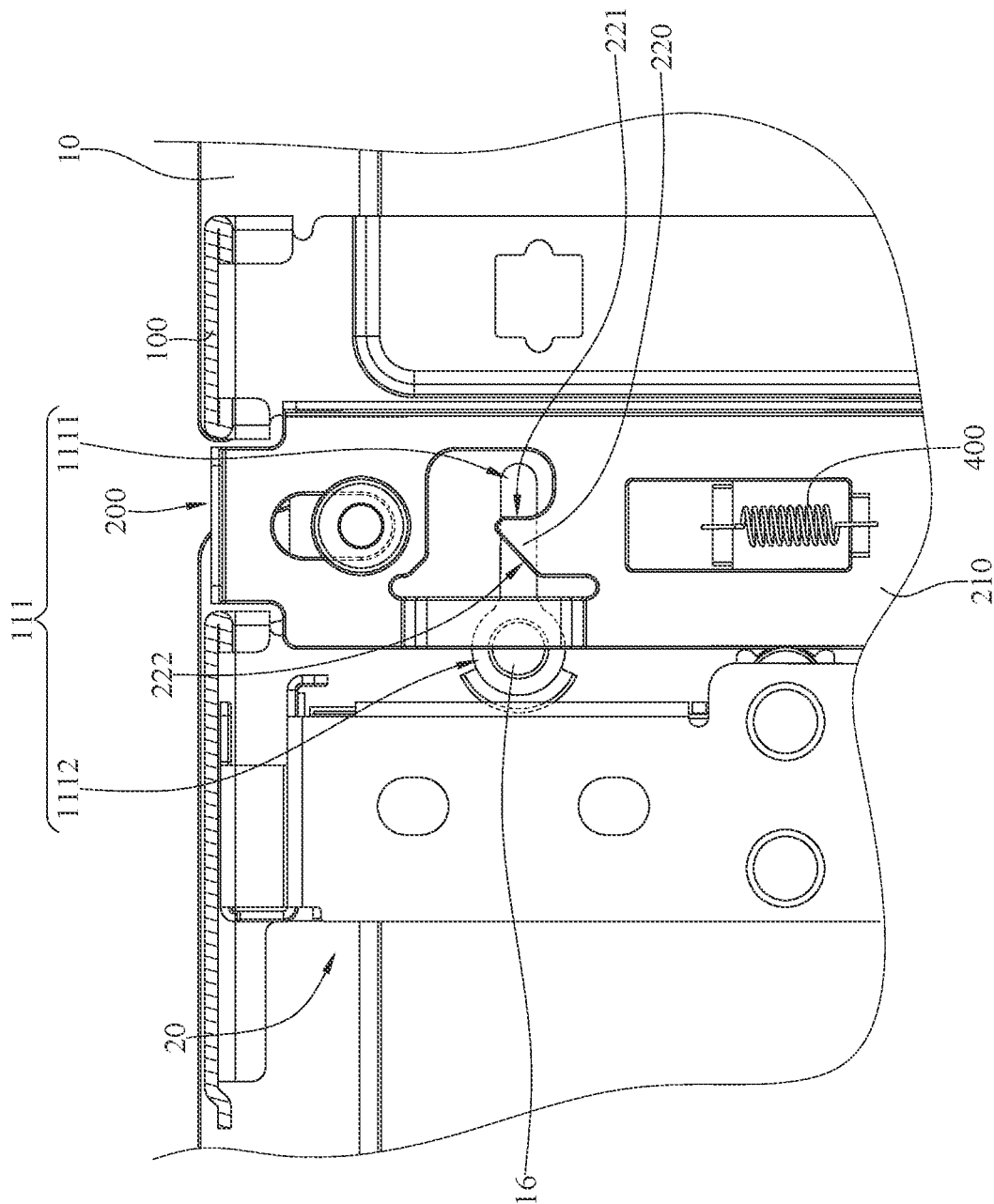
FIGS. 8 to 11 show the assembly of the support device and the casing in FIG. 1.
Figure 9:
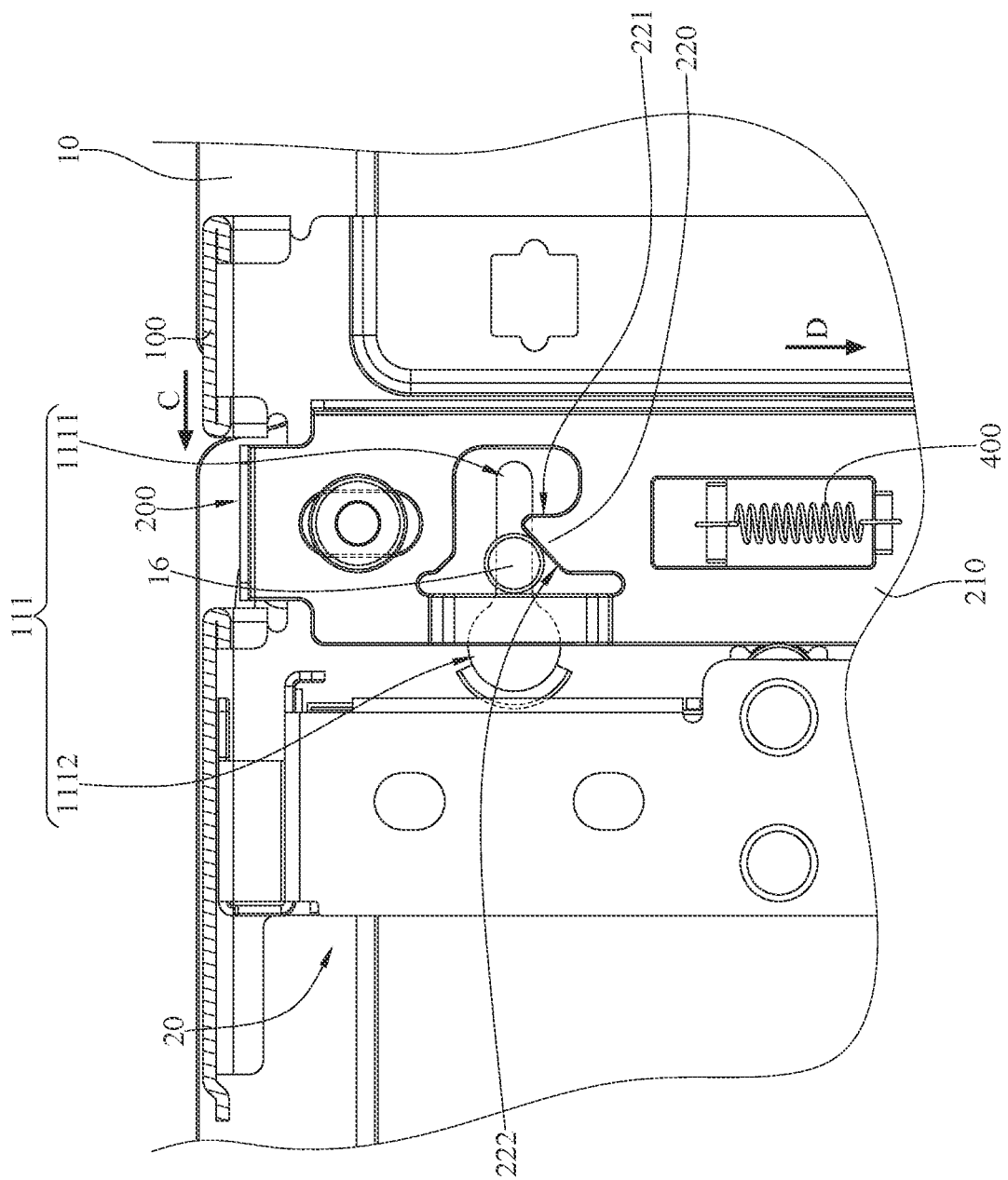
Figure 10:
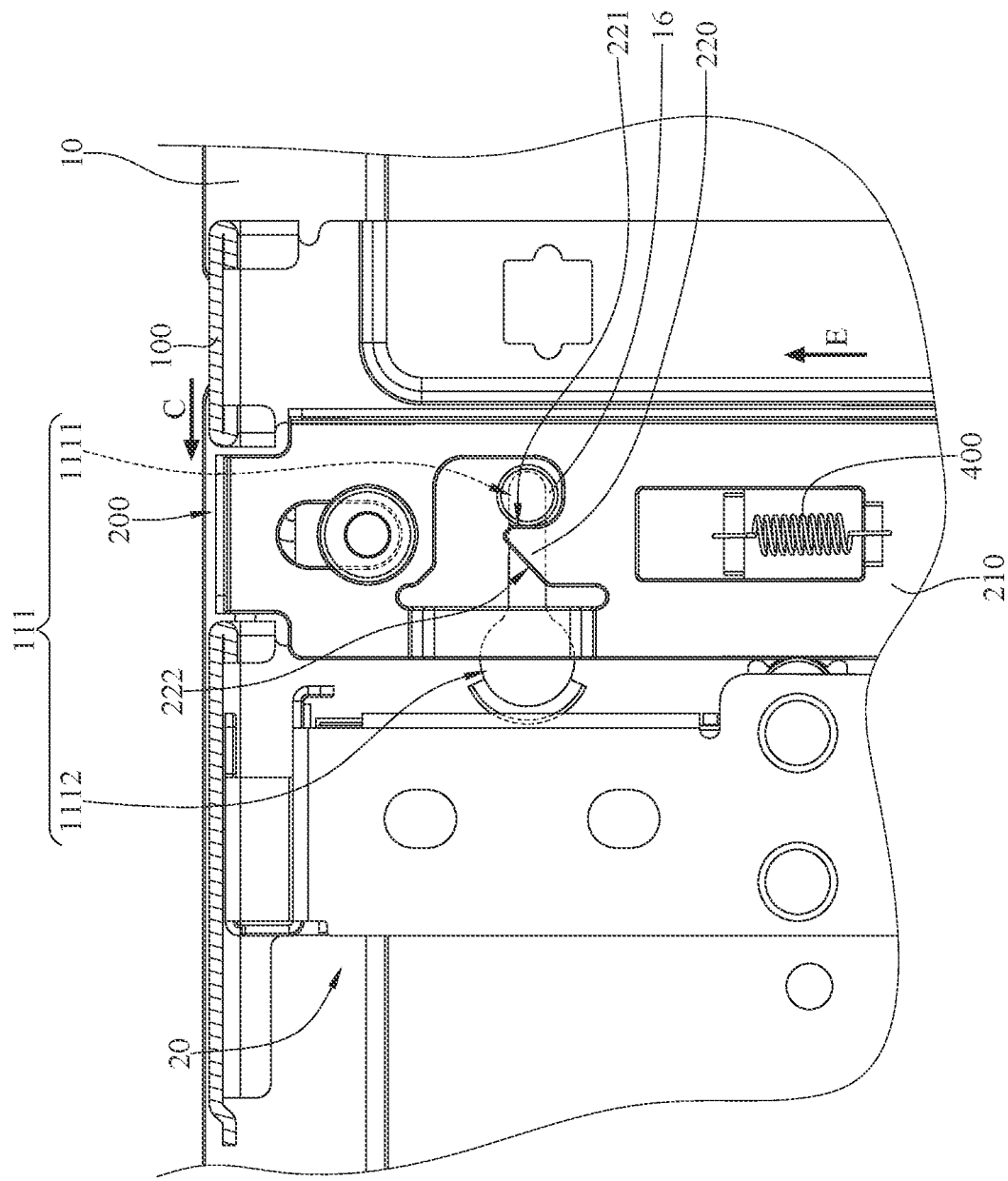
Figure 11:
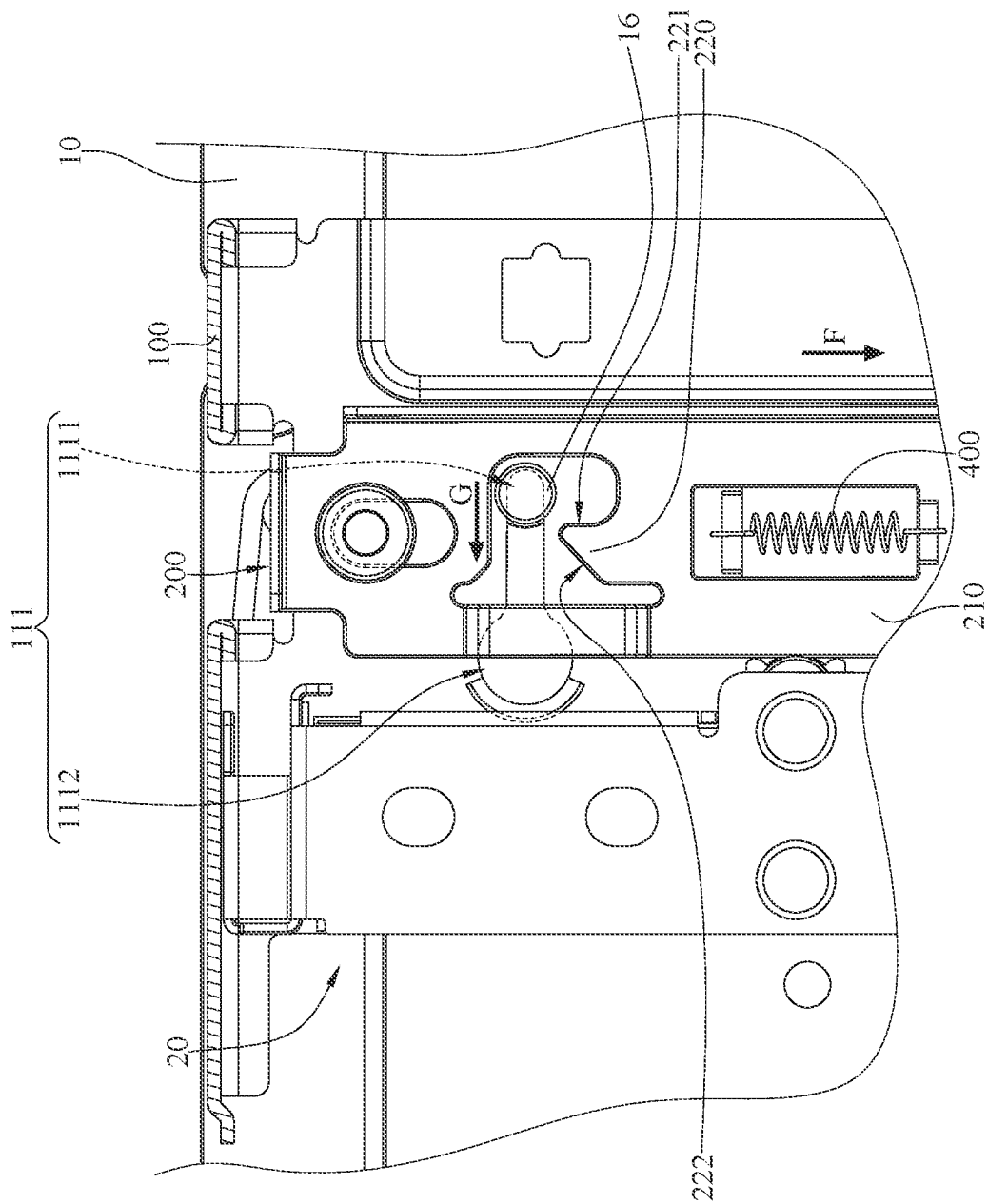

Refer to FIGS. 8 to 11, where FIGS. 8 to 11 show the assembly of the support device 20 and the casing 10 in FIG. 1. As shown in FIG. 8, the fasteners 16 of the casing 10 are respectively inserted into the second ends 1112 of the through holes 111 of the first mount plate 110 of the base frame 100. Then, as shown in FIG. 9, the base frame 100 of the support device 20 is moved relative to the casing 10 along a direction C, such that the fasteners 16 of the casing 10 are respectively moved from the second ends 1112 towards the first ends 1111 of the through holes 111. Since the positioning portions 220 of the positioning frame 200 are respectively located on paths from the second ends 1112 to the first ends 1111 of the through holes 111, during the movements of the support device 20, the fasteners 16 respectively press against the guide surfaces 222 of the positioning portions 220 of the positioning frame 200 so as to move the positioning frame 200 downwards along a direction D and move the positioning portions 220 of the positioning frame 200 out of the paths from the second ends 1112 to the first ends 1111 of the through holes 111. Therefore, as shown in FIG. 10, the fasteners 16 of the casing 10 can respectively reach the first ends 1111 of the through holes 111. Once the fasteners 16 of the casing 10 respectively reach the first ends 1111 of the through holes 111, the positioning portions 220 of the positioning frame 200 are no longer pressed by the fasteners 16 of the casing, and thus the restoring component 400 forces the positioning frame 200 to move upwards to return to the first position; that is, the positioning portions 220 of the positioning frame 200 return to the positions respectively located on the paths from the second ends 1112 to the first ends 1111 of the through holes 111 and restrict the fasteners 16 of the casing 10 at the first ends 1111 of the through holes 111. As a result, the support device 20 can be rapidly mounted on the casing 10. On the other hand, as shown in FIG. 11, the positioning frame 200 can be pressed downwards along a direction F to move the positioning portions 220 out of the paths from the second ends 1112 to the first ends 1111 of through holes 111, and then the support device 20 can be moved to make the fasteners 16 of the casing 10 reach to the second ends 1112 from the first ends 1111 of the through holes 111 along a direction G.

According to the server casing assembly and the support device as disclosed above, the positioning frame is movably disposed on the base frame, such that the fasteners of the casing can be respectively and rapidly restricted in the first ends of the through hole or reach the second ends of the through holes. Therefore, the support device can be efficiently and reliably mounted on the casing.

In addition, the different sides of the connectors are connected to the base frame and the mount frame via the pads, such that the connectors can be slightly movable along X axis and Z axis so as to facilitate the connections between the connectors and the corresponsive connectors.

Moreover, the cooperation of the first positioning holes, the second positioning holes and the positioning walls of the mount frame and the first positioning protrusions, the second positioning protrusions and the outer surfaces of the connectors defines the movement range of the connectors relative to the base frame along Y axis. Specifically, when the connectors are respectively connected to the corresponsive connectors, the corresponsive connectors may push the connectors, such that the first positioning protrusions, the second positioning protrusions, and the outer surfaces of the connectors may be interfered with the mount frame so as to prevent the connectors from moving along the negative Y-axis direction, thereby facilitating the connections between the connectors and the corresponsive connectors.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A support device, holding at least one connector in a casing, the support device comprising:
   a base frame, comprising a first mount plate, wherein the first mount plate has at least one through hole with a first end and a second end opposite to each other, at least one fastener of the casing is disposed through the at least one through hole, and the at least one connector is disposed on the first mount plate; and
   a positioning frame, comprising at least one positioning portion, wherein the positioning frame is movably disposed on the base frame and is movable between a first position and a second position;
   wherein when the positioning frame is located in the first position, the at least one positioning portion of the positioning frame is located between the first end and the second end of the at least one through hole; when the positioning frame is located in the second position, the at least one positioning portion of the positioning frame is not located between the first end and the second end of the at least one through hole.

2. The support device according to claim 1, further comprising a mount frame, wherein the mount frame is mounted on the first mount plate of the base frame.

3. The support device according to claim 2, further comprising a plurality of pads, wherein the mount frame and the base frame form at least one accommodation space, and the plurality of pads are respectively mounted on the mount frame and the base frame and located at different sides of the at least one accommodation space.

4. The support device according to claim 2, wherein the mount frame comprises a frame body and a partition, the frame body is mounted on the base frame, the partition is fixed to the frame body, and the frame body, the partition and the base frame form two accommodation spaces.

5. The support device according to claim 4, wherein the base frame further comprises two second mount plates, the two second mount plates are respectively connected to two opposite sides of the first mount plate, the frame body of the mount frame comprises a first plate and two second plates, the two second plates are respectively connected to two opposite sides of the first plate, the partition is fixed to the first plate of the frame body, and the two second plates are respectively mounted on the two second mount plates of the base frame.

6. The support device according to claim 5, wherein the base frame further comprises a first mount structure and a second mount structure, the first mount structure and the second mount structure are respectively located at the first mount plate and one of the two second mount plates, the mount frame further comprises a third mount structure and a fourth mount structure, the third mount structure and the fourth mount structure are respectively located at the partition and one of the second plates, the third mount structure and the first mount structure are respectively an engagement hole and an engagement block, the third mount structure is removably assembled with the first mount structure, the second mount structure and the fourth mount structure are respectively an engagement hole and an engagement block, and the fourth mount structure is removably assembled with the second mount structure.

7. The support device according to claim 5, further comprising two fasteners, wherein each of the two second mount plates of the base frame has a first mount hole, each of the two second plates of the mount frame has a second mount hole, and the two fasteners are respectively disposed in the first mount holes of the second mount plates and fixed in the second mount holes of the second plates.

8. The support device according to claim 1, wherein the positioning frame further comprises a main portion, the main portion is slidably disposed on the first mount plate, the at least one positioning portion is connected to the main portion, the at least one positioning portion has a positioning surface and a guide surface respectively located at two opposite sides of the at least one positioning portion; when the positioning frame is located in the first position, and the positioning surface of the at least one positioning portion of the positioning frame positions the at least one fastener of the casing at the first end of the at least one through hole.

9. The support device according to claim 8, further comprising a restoring component, wherein one end of the restoring component is fixed to the base frame, and another end of the restoring component is fixed to the main portion of the positioning frame for moving the positioning frame towards the first position.

10. The support device according to claim 1, further comprising at least one wire holder, wherein the at least one wire holder is mounted on the first mount plate of the base frame.

11. A server casing assembly, comprising:
a casing, comprising a bottom plate, a side plate and at least one fastener, wherein the side plate is connected to a side of the bottom plate, and the at least one fastener is mounted on the side plate;
a support device, comprising:
a base frame, comprising a first mount plate, wherein the first mount plate has at least one through hole with a first end and a second end opposite to each other, the at least one fastener of the casing is disposed through the at least one through hole; and
a positioning frame, comprising at least one positioning portion, wherein the positioning frame is movably disposed on the base frame and is movable between a first position and a second position;
wherein when the positioning frame is located in the first position, the at least one positioning portion of the positioning frame is located between the first end and the second end of the at least one through hole; when the positioning frame is located in the second position, the at least one positioning portion of the positioning frame is not located between the first end and the second end of the at least one through hole; and
at least one connector, disposed on the first mount plate.

12. The server casing assembly according to claim 11, wherein the support device further comprises a mount frame, the mount frame is mounted on the first mount plate of the base frame.

13. The server casing assembly according to claim 12, wherein the mount frame and the base frame form at least one accommodation space, and the support device further comprises a plurality of pads, the plurality of pads are respectively mounted on the mount frame and the base frame and located at different sides of the at least one accommodation space.

14. The server casing assembly according to claim 12, wherein the mount frame comprises a frame body and a partition, the frame body is mounted on the base frame, the partition is fixed to the frame body, and the frame body, the partition and the base frame form two accommodation spaces.

15. The server casing assembly according to claim 14, wherein the base frame further comprises two second mount plates, the two second mount plates are respectively connected to two opposite sides of the first mount plate, the frame body of the mount frame comprises a first plate and two second plates, the two second plates are respectively connected to two opposite sides of the first plate, the partition is fixed to the first plate of the frame body, and the two second plates are respectively mounted on the two second mount plates of the base frame.

16. The server casing assembly according to claim 15, wherein the base frame further comprises a first mount structure and a second mount structure, the first mount structure and the second mount structure are respectively located at the first mount plate and one of the two second mount plates, the mount frame further comprises a third mount structure and a fourth mount structure, the third mount structure and the fourth mount structure are respectively located at the partition and one of the second plates, the third mount structure and the first mount structure are respectively an engagement hole and an engagement block, the third mount structure is removably assembled with the first mount structure, the second mount structure and the fourth mount structure are respectively an engagement hole and an engagement block, and the fourth mount structure is removably assembled with the second mount structure.

17. The server casing assembly according to claim 15, wherein the first plate has at least one first positioning hole, the at least one connector comprises a plug and at least one first positioning protrusion, the at least one first positioning protrusion protrudes from the plug, and the at least one first positioning protrusion is located in the at least one first positioning hole.

18. The server casing assembly according to claim 17, wherein a gap is formed between the at least one first positioning protrusion and the first plate.

19. The server casing assembly according to claim 17, wherein one of the second plates or the partition has at least one second positioning hole, the at least one connector further comprises at least one second positioning protrusion, the at least one second positioning protrusion protrudes from the plug, the at least one first positioning protrusion and the at least one second positioning protrusion are respectively located two different sides of the plug, and the at least one second positioning protrusion is located in the at least one second positioning hole.

20. The server casing assembly according to claim 19, wherein the frame body further comprises a positioning wall, the positioning wall is connected to the first plate, the plug of the at least one connector has an outer surface, the outer surface, the at least one first positioning protrusion and the at least one second positioning protrusion are respectively located at different sides of the plug, and the outer surface faces the positioning wall.

* * * * *